United States Patent
Jin et al.

(10) Patent No.: US 10,439,739 B2
(45) Date of Patent: Oct. 8, 2019

(54) DIVIDED RING FOR COMMON-MODE (CM) AND DIFFERENTIAL-MODE (DM) ISOLATION

(71) Applicant: QUALCOMM Incorporated, San Diego, CA (US)

(72) Inventors: Zhang Jin, San Diego, CA (US); Yung-Chung Lo, San Diego, CA (US); Youngchang Yoon, San Diego, CA (US); Ning Yuan, San Diego, CA (US); Apsara Ravish Suvarna, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 663 days.

(21) Appl. No.: 14/737,611

(22) Filed: Jun. 12, 2015

(65) Prior Publication Data

US 2016/0365189 A1 Dec. 15, 2016

(51) Int. Cl.
  *H01F 27/32* (2006.01)
  *H04B 15/02* (2006.01)
  *H04B 3/28* (2006.01)
  *H01F 27/36* (2006.01)
  *H01L 23/522* (2006.01)
  *H01F 17/00* (2006.01)

(52) U.S. Cl.
CPC .......... *H04B 15/02* (2013.01); *H01F 27/362* (2013.01); *H01L 23/5225* (2013.01); *H01L 23/5227* (2013.01); *H04B 3/28* (2013.01); *H01F 2017/0093* (2013.01)

(58) Field of Classification Search
CPC ............... H01L 23/645; H01L 23/5227; H01F 2017/0093; H01F 27/2804; H01F 17/0006; H01F 2021/125; H01F 27/00; H01F 41/041
USPC ...................................................... 336/84 C
See application file for complete search history.

(56) References Cited

U.S. PATENT DOCUMENTS 5,977,853 A * 11/1999 Ooi .................. H01F 17/04
                                                         336/160
6,740,953 B2    5/2004 Tanabe
(Continued)

FOREIGN PATENT DOCUMENTS

EP           2767993 A2      8/2014

OTHER PUBLICATIONS

International Search Report and Written Opinion—PCT/US2016/036171—ISA/EPO—dated Sep. 15, 2016.

*Primary Examiner* — Alexander Talpalatski
*Assistant Examiner* — Joselito Baisa
(74) *Attorney, Agent, or Firm* — Patterson & Sheridan, L.L.P. Qualcomm

(57) ABSTRACT

Certain aspects of the present disclosure provide techniques and apparatus employing an isolation ring having a center strip of conductive material used to isolate magnetic fields generated by common-mode and differential-mode current flow through one or more inductors disposed in the ring. The apparatus generally includes an electrical component having an inductive element and a ring of electrically conductive material encircling the inductive element, wherein the ring has a strip of electrically conductive material disposed in the ring and connecting a first point on the ring to a second point on the ring.

29 Claims, 8 Drawing Sheets

(56) References Cited

U.S. PATENT DOCUMENTS

| | | | |
|---|---|---|---|
| 6,921,959 B2* | 7/2005 | Watanabe | H01L 23/5227 257/127 |
| 7,075,329 B2* | 7/2006 | Chen | H01F 17/0006 257/531 |
| 7,414,511 B2* | 8/2008 | Wu | H01F 17/04 336/212 |
| 8,441,334 B2* | 5/2013 | Kawano | H01F 21/02 336/200 |
| 8,559,186 B2 | 10/2013 | Jin | |
| 8,592,943 B2 | 11/2013 | Wu et al. | |
| 8,643,772 B2* | 2/2014 | Anderson | H04N 5/2252 348/373 |
| 8,957,496 B2 | 2/2015 | Li et al. | |
| 9,536,654 B2* | 1/2017 | Nakamura | B60L 53/38 |
| 2005/0051869 A1* | 3/2005 | Watanabe | H01L 23/5227 257/531 |
| 2008/0048294 A1 | 2/2008 | Yamamoto | |
| 2008/0129438 A1* | 6/2008 | Lee | H01F 1/26 336/220 |
| 2009/0051478 A1 | 2/2009 | Lee et al. | |
| 2009/0268470 A1* | 10/2009 | Okimura | F21K 9/20 362/311.02 |
| 2009/0295524 A1 | 12/2009 | Silva | |
| 2013/0265132 A1* | 10/2013 | Huang | H01F 27/2804 336/192 |
| 2014/0225698 A1* | 8/2014 | Swirhun | H01F 27/292 336/192 |

* cited by examiner

DIVIDED RING FOR COMMON-MODE (CM) AND DIFFERENTIAL-MODE (DM) ISOLATION

TECHNICAL FIELD

Certain aspects of the present disclosure generally relate to electronic circuits and, more particularly, to a divided ring for isolation of magnetic fields generated by an inductive element.

BACKGROUND

Wireless communication networks are widely deployed to provide various communication services such as telephony, video, data, messaging, broadcasts, and so on. Such networks, which are usually multiple access networks, support communications for multiple users by sharing the available network resources. For example, one network may be a 3G (the third generation of mobile phone standards and technology) system, which may provide network service via any one of various 3G radio access technologies (RATs) including EVDO (Evolution-Data Optimized), 1×RTT (1 times Radio Transmission Technology, or simply 1×), W-CDMA (Wideband Code Division Multiple Access), UMTS-TDD (Universal Mobile Telecommunications System—Time Division Duplexing), HSPA (High Speed Packet Access), GPRS (General Packet Radio Service), or EDGE (Enhanced Data rates for Global Evolution). The 3G network is a wide area cellular telephone network that evolved to incorporate high-speed internet access and video telephony, in addition to voice calls. Furthermore, a 3G network may be more established and provide larger coverage areas than other network systems. Such multiple access networks may also include code division multiple access (CDMA) systems, time division multiple access (TDMA) systems, frequency division multiple access (FDMA) systems, orthogonal frequency division multiple access (OFDMA) systems, single-carrier FDMA (SC-FDMA) networks, 3rd Generation Partnership Project (3GPP) Long Term Evolution (LTE) networks, and Long Term Evolution Advanced (LTE-A) networks.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station.

SUMMARY

Certain aspects of the present disclosure generally relate to an apparatus including an isolation ring having a center strip of electrically conductive material used to isolate magnetic fields generated by common-mode and differential-mode current flow through one or more inductors from interfering with other components.

Certain aspects of the present disclosure provide an apparatus for reducing electromagnetic coupling between multiple inductive elements. The apparatus generally includes an electrical component having a first inductive element and a ring of electrically conductive material encircling the first inductive element, wherein the ring has a first strip of electrically conductive material disposed in the ring and connecting a first point on the ring to a second point on the ring.

In certain aspects, the first strip provides a loop in the ring for a common-mode image current to flow.

In certain aspects, a first common-mode current, coupled onto a first portion of the ring by a second common-mode current flowing in the first inductive element, may be configured to flow through the first strip. In this case, a third common-mode current, coupled onto a second portion of the ring by the second common-mode current flowing in the first inductive element, may be configured to flow through the first strip in the same direction as the first common-mode current. The first and second portions may include opposite sides of the ring.

In certain aspects, the ring may be electrically floating. For other aspects, the ring may be connected to an electric potential, such as electrical ground or a power supply rail (e.g., VDD).

In certain aspects, the first inductive element has a first line of symmetry, and the first strip lies on the first line of symmetry. In certain aspects, the first strip follows the entire first line of symmetry through the first inductive element.

In certain aspects, the electrical component has a second inductive element. In this case, the ring may be configured to encircle the first inductive element and the second inductive element. For example, the electrical component may include a transformer, and the first and second inductive elements may include windings of the transformer.

In certain aspects, the first inductive element has a first line of symmetry, and the second inductive element has a second line of symmetry aligned with the first line of symmetry. In certain aspects, at least a portion of the first strip may be disposed in a plane defined by the first line of symmetry and the second line of symmetry.

In certain aspects, the ring further comprises a second strip of electrically conductive material disposed in the ring and connecting a third point on the ring with a fourth point on the ring. In certain aspects, the first inductive element has a first line of symmetry, and the second inductive element has a second line of symmetry at an angle with respect to the first line of symmetry. In this case, the first strip may be aligned with the first line of symmetry, and the second strip may be aligned with the second line of symmetry. In certain aspects, the first strip is perpendicular to the second strip.

In certain aspects, the ring is electromagnetically coupled to the first inductive element.

In certain aspects, the first strip is configured to divide the ring into two (equal) halves.

In certain aspects, the first strip is configured to reduce common-mode coupling with another electrical component located outside the ring.

In certain aspects, the ring may be rectangular.

Certain aspects of the present disclosure provide a method of operating an electrical circuit. The method generally includes causing a first variable current to flow in a first inductive element; causing a second variable current to flow in a second inductive element; and reducing electromagnetic coupling between the first inductive element and the second inductive element via one or more currents flowing in a ring of electrically conductive material encircling the second inductive element, the ring comprising a first strip of electrically conductive material disposed in the ring and connecting a first point on the ring to a second point on the ring, wherein the first inductive element is disposed outside of the ring.

Certain aspects of the present disclosure provide an apparatus for reducing electromagnetic coupling between multiple inductive elements. The apparatus generally includes means for causing a first variable current to flow in a first inductive element; means for causing a second variable current to flow in a second inductive element; and means for reducing electromagnetic coupling between the first inductive element and the second inductive element via one or more currents flowing in a ring of electrically conductive material encircling the second inductive element, the ring comprising a first strip of electrically conductive material disposed in the ring and connecting a first point on the ring to a second point on the ring, wherein the first inductive element is disposed outside of the ring.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the present disclosure are described below. It should be apparent that the teachings herein may be embodied in a wide variety of forms and that any specific structure, function, or both being disclosed herein is merely representative. Based on the teachings herein, one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. Furthermore, an aspect may comprise at least one element of a claim.

The word "exemplary" is used herein to mean "serving as an example, instance, or illustration." Any aspect described herein as "exemplary" is not necessarily to be construed as preferred or advantageous over other aspects.

The techniques described herein may be used in combination with various wireless technologies such as Code Division Multiple Access (CDMA), Orthogonal Frequency Division Multiplexing (OFDM), Time Division Multiple Access (TDMA), Spatial Division Multiple Access (SDMA), Single Carrier Frequency Division Multiple Access (SC-FDMA), Time Division Synchronous Code Division Multiple Access (TD-SCDMA), and so on. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband-CDMA (W-CDMA), or some other standards. An OFDM system may implement Institute of Electrical and Electronics Engineers (IEEE) 802.11, IEEE 802.16, Long Term Evolution (LTE) (e.g., in TDD and/or FDD modes), or some other standards. A TDMA system may implement Global System for Mobile Communications (GSM) or some other standards. These various standards are known in the art.

An Example Wireless System

Figure 1:
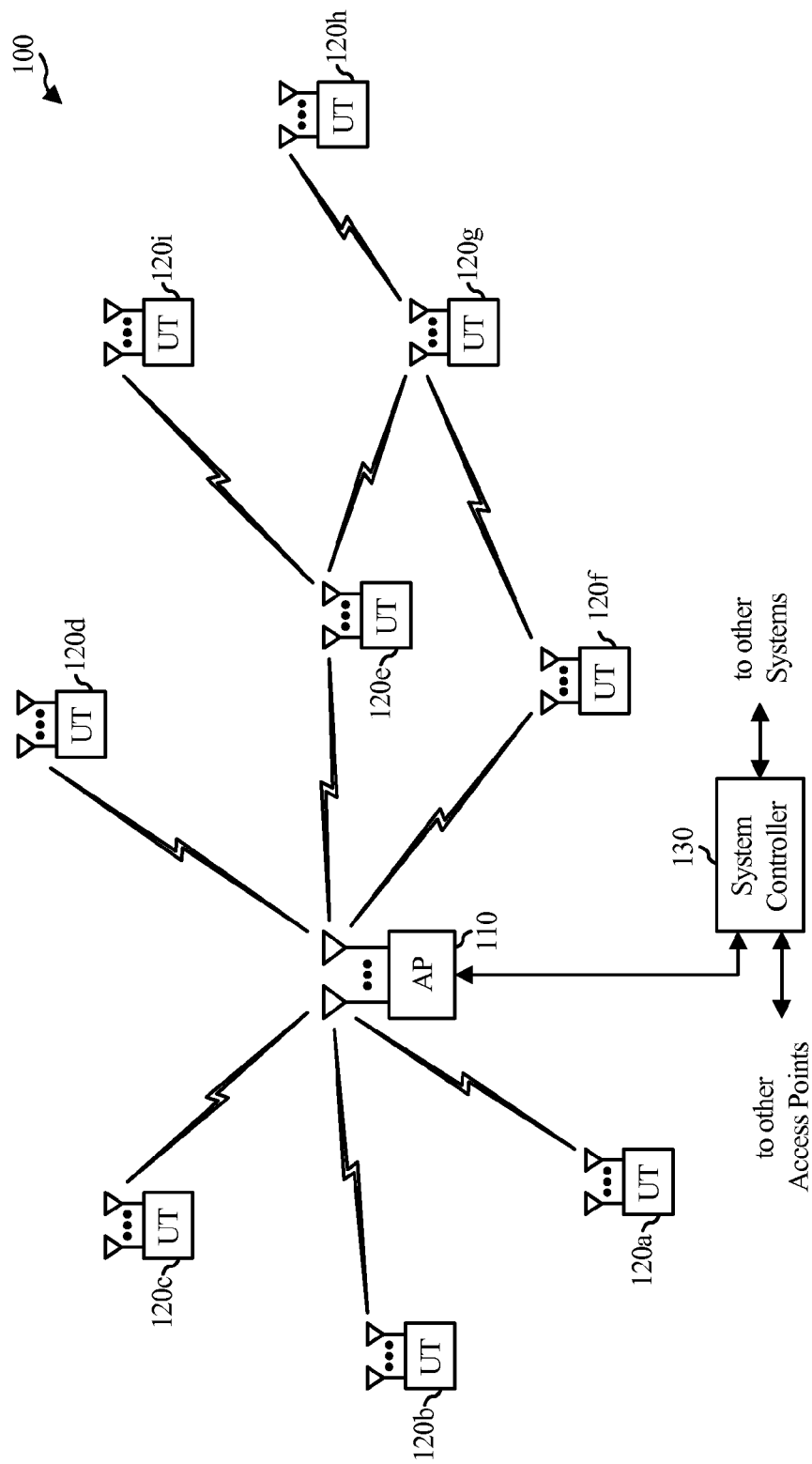
FIG. 1 is a diagram of an example wireless communications network in accordance with certain aspects of the present disclosure.

FIG. 1 illustrates a wireless communications system 100 with access points 110 and user terminals 120. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal 120 may be equipped with a single antenna (e.g., in order to keep costs down) or multiple antennas (e.g., where the additional cost can be supported).

In certain aspects of the present disclosure, the access point 110 or user terminals 120 may include a divided ring of electrically conductive material for isolation, or at least reduction, of magnetic fields generated by both differential-mode and common-mode currents as described in more detail below.

Figure 2:
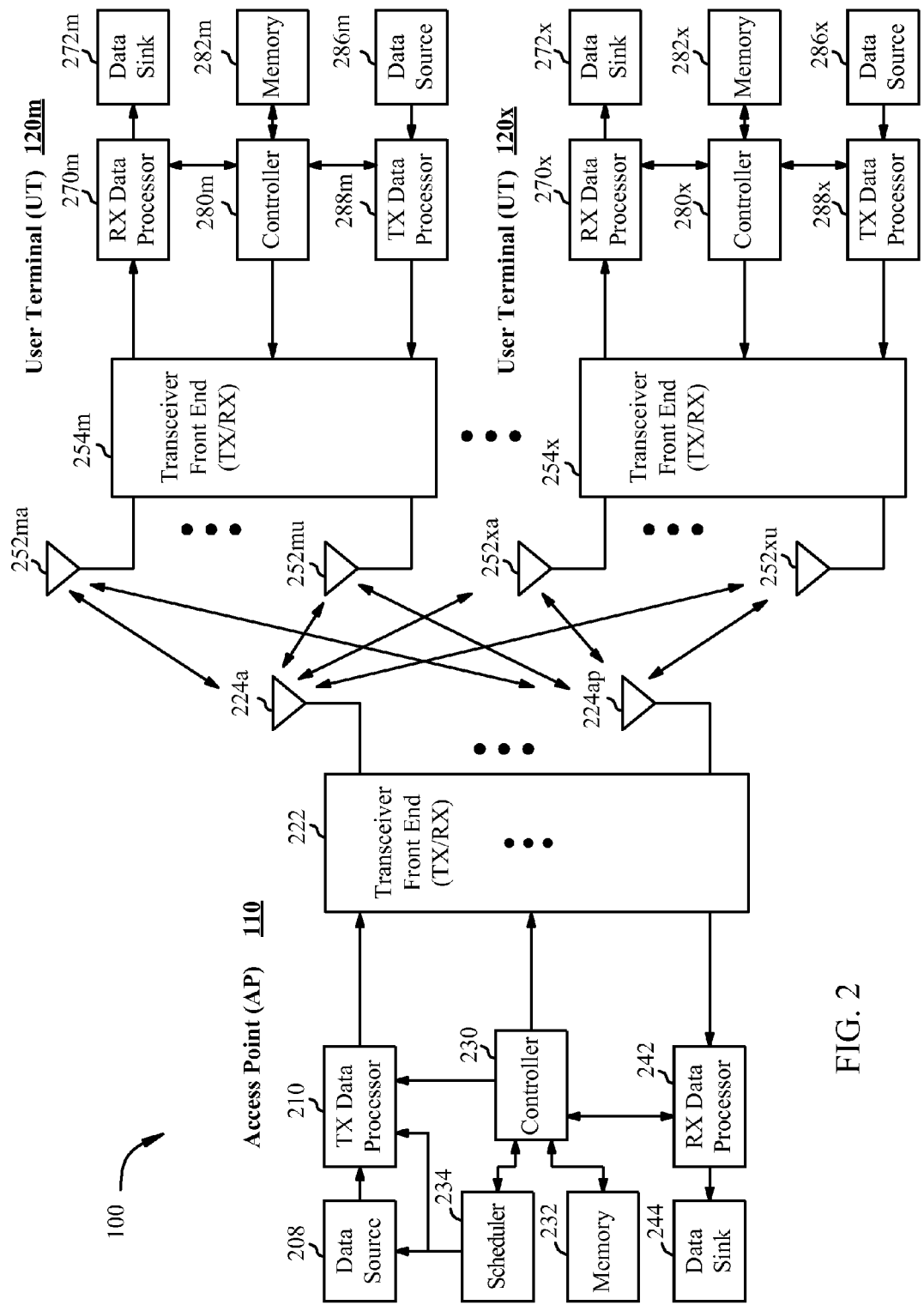
FIG. 2 is a block diagram of an example access point (AP) and example user terminals in accordance with certain aspects of the present disclosure.

FIG. 2 shows a block diagram of access point 110 and two user terminals 120m and 120x in wireless system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via a radio frequency (RF) switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

In certain aspects of the present disclosure, the transceiver front end (TX/RX) 222 of an access point 110 or the transceiver front end 254 of a user terminal 120 may include a divided ring of electrically conductive material for isolation, or at least reduction, of magnetic fields generated by both differential-mode and common-mode currents as described in more detail below.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal TX data processor 210 may provide a downlink data symbol stream for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230

At each user terminal 120, $N_{ut,m}$ antennas 252 receive the downlink signals from access point 110. For receive diversity at the user terminal 120, the transceiver front end 254 may select signals received from one of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Those skilled in the art will recognize the techniques described herein may be generally applied in systems utilizing any type of multiple access schemes, such as TDMA, SDMA, Orthogonal Frequency Division Multiple Access (OFDMA), CDMA, SC-FDMA, TD-SCDMA, and combinations thereof.

Figure 3:
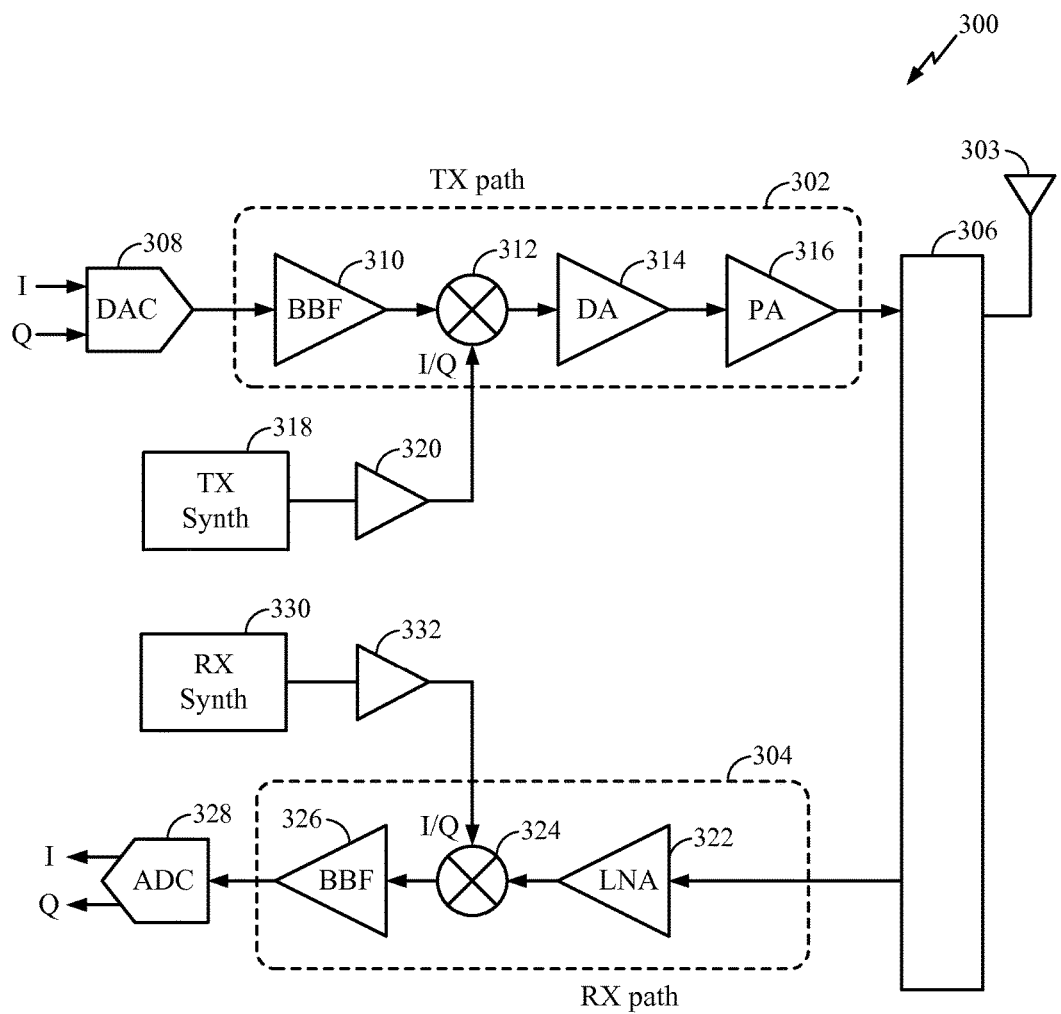
FIG. 3 is a block diagram of an example transceiver front end in accordance with certain aspects of the present disclosure.

FIG. 3 is a block diagram of an example transceiver front end 300, such as transceiver front ends 222, 254 in FIG. 2, in accordance with certain aspects of the present disclosure. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 is often external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). Known as heterodyning, this frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which are amplified by the DA 314 and by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning to different frequencies indicates using a variable-frequency oscillator, which involves compromises between stability and tunability. Contemporary systems may employ frequency synthesizers with a voltage-controlled oscillator (VCO) to generate a stable, tunable LO with a particular tuning range. Thus, the transmit LO is typically produced by a TX frequency synthesizer 318, which may be buffered or amplified by amplifier 320 before being mixed with the baseband signals in the mixer 312. Similarly, the receive LO is typically produced by an RX frequency synthesizer 330, which may be buffered or amplified by amplifier 332 before being mixed with the RF signals in the mixer 324.

The output of the amplifier 316 may be coupled with one or more inductive elements. In certain aspects of the present disclosure, a divided isolation ring of electrically conductive material may be used to isolate, or at least reduce, the magnetic fields generated by both differential-mode and common-mode currents through the inductive elements coupled to the output of amplifier 316, as described in more detail below.

Figure 4:
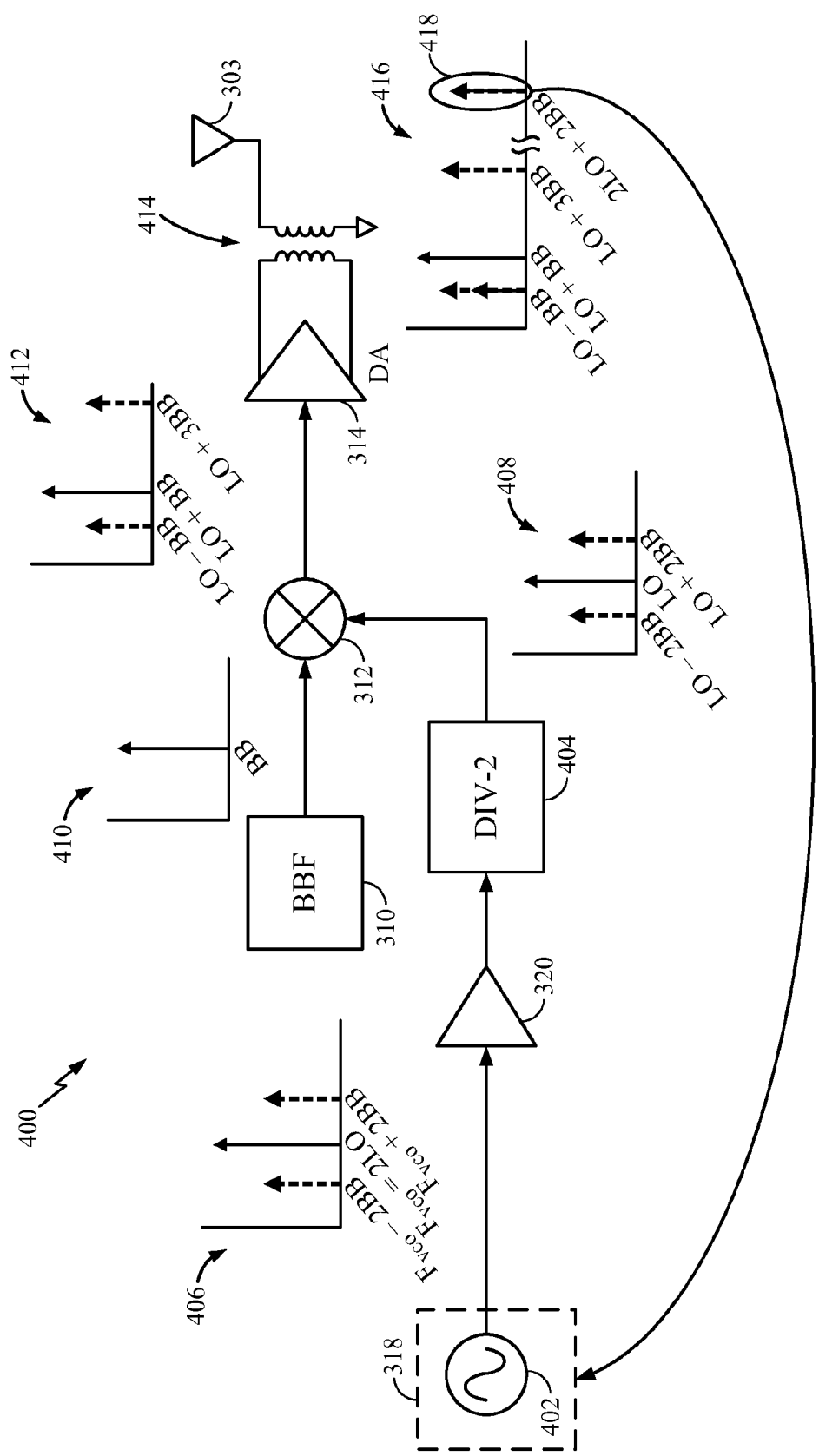
FIG. 4 is a block diagram of an example transmit chain having a differential drive amplifier (DA) driving a balun with undesired inductive coupling to a voltage-controlled oscillator (VCO) inductor, in accordance with certain aspects of the present disclosure.

FIG. 4 is a block diagram of an example transmit chain 400 (e.g., in the transceiver front end 300) illustrating example frequency spectrums of signals present at various nodes of the transmit chain, in accordance with certain aspects of the present disclosure. As described above, the TX frequency synthesizer 318 may be used to generate an oscillating signal that is mixed with a baseband signal using the mixer 312. That is, a signal may be generated by a VCO 402 of the synthesizer 318, which may be buffered or amplified by the amplifier 320. The frequency of the signal output by the amplifier 320 may be reduced by a frequency divider, such as a divide-by-two frequency divider (DIV-2) 404, to generate the desired LO frequency. Therefore, the oscillating signal at the output of the VCO 402 has a corresponding frequency that is a multiple of the LO frequency (e.g., in this case twice the LO frequency, as illustrated in the frequency spectrum 406). However, the output of the VCO 402 may also have non-idealities (i.e., unwanted frequency components) as illustrated in the spectrum 406, which may be due to remodulation.

The LO signal at the output of the divider 404 may be mixed via the mixer 312 with a baseband signal (e.g., having a baseband (BB) frequency as illustrated in frequency spectrum 410) from the baseband filter (BBF) 310 in the transmit chain 400. The mixed signal may have an upconverted signal at the desired frequency (e.g., the LO frequency plus the BB frequency) and several non-idealities due to remodulation, as illustrated in frequency spectrum 412. The mixed signal may be amplified by an amplifier (e.g., differential driver amplifier (DA) 314) and may be sent to an antenna 303 through a transformer balun 414, for wireless transmission. As illustrated in frequency spectrum 416, the signal at the balun 414 may include the upconverted signal at the desired frequency (e.g., the LO frequency plus the BB frequency), as well as several non-idealities due to remodulation, for example. Moreover, there may be non-idealities (e.g., frequency component 418 at twice the LO frequency plus twice the BB frequency) in the frequency spectrum 416 at the balun 414, which may be due to the signal path.

Magnetic fields generated by current flowing in the primary or secondary windings of the transformer balun 414 may interfere with one or more inductors in the VCO. That is, the signal frequency at frequency component 418 may be magnetically coupled with components of the VCO and cause interference with the one or more inductors of the VCO. This interference may undesirably alter the frequency of the VCO's oscillating output signal and other VCO parameters, such as phase noise and the like. The magnetic fields that cause these interferences may be due to common-mode and/or differential-mode current flow through the balun 414. Similarly, these signals may interfere with other components, routings, or circuits that may be in close proximity to the balun 414.

Example Divided Ring for Common-Mode (CM) and Differential-Mode (DM) Isolation

Figure 5B:
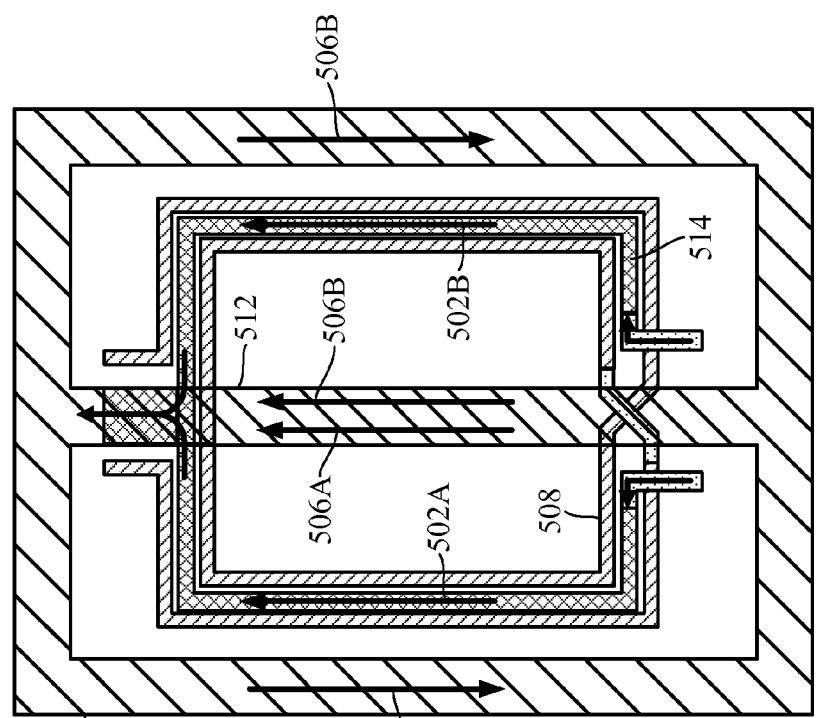
FIGS. 5A and 5B are example layouts of transformer windings inside an isolation ring with common-mode current flowing through one of the windings, in accordance with certain aspects of the present disclosure.

Aspects of the present disclosure provide apparatus and techniques for isolating magnetic fields generated by differential-mode and common-mode current flow in an inductor. For example, the inductor may be disposed inside an isolation ring (e.g., a ring of conductive material), which may be electrically floating (i.e., not electrically connected to any electrical potential, such as ground or a power rail). The isolation ring may be magnetically coupled with the inductor, and thus, differential-mode current flow through the inductor may generate an image current flowing in the isolation ring. The current flow in the ring will serve to isolate magnetic fields generated by the inductor. That is, magnetic fields generated by image current will cancel (e.g., isolate), or at least counteract, magnetic fields generated by the current flow in the inductor. In addition to differential-mode current flow, there may also be common-mode current flow in the inductor, as illustrated in FIGS. 5A and 5B.

Figure 5A:
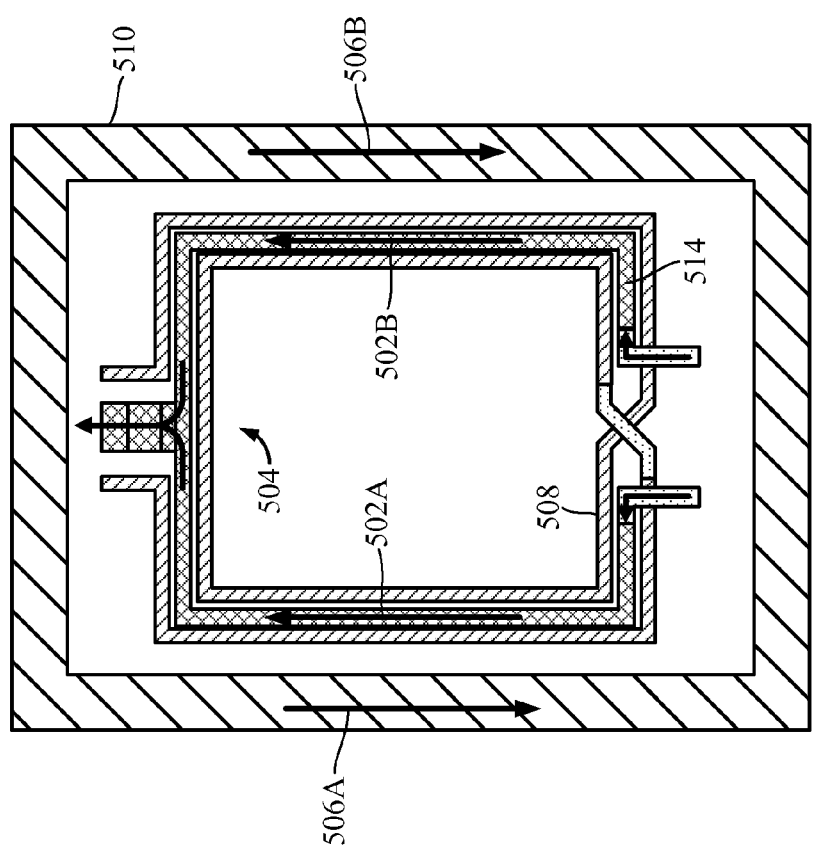

FIG. 5A illustrates an example layout of an inductor 508 (e.g., secondary or primary winding of transformer balun 414) disposed inside an isolation ring 510 (e.g., a ring of electrically conductive material), in accordance with certain aspects of the present disclosure. As illustrated, there may be common-mode current flow (e.g., in the direction of arrows representing common-mode currents 502A and 502B, collectively 502) through the inductor 508. The common-mode currents 502A and 502B may flow in opposite directions. That is, both common-mode currents 502A and 502B are flowing towards a center tap 504 of the balun. Thus, common-mode currents 502A and 502B may flow out of the inductor 508 via the center tap 504 of the balun (e.g., through a parasitic capacitance at the center tap 504, not shown).

The isolation ring 510 may be magnetically coupled with the inductor 508. That is, the isolation ring 510 may be in close proximity with the inductor 508, sufficiently close such that magnetic fields generated by current flowing through the inductor 508 produce an image current flowing through the isolation ring 510 (typically in the opposite direction). Thus, the common-mode current 502A of the inductor 508 may generate an image current 506A, and the common-mode current 502B of the inductor 508 may generate an image current 506B, on the ring 510. However, since image currents 506A and 506B flow in opposite directions, image currents 506A and 506B may cancel each other out, and no actual current may flow in the ring 510. As a result, the isolation ring 510 may not provide sufficient isolation for common-mode current flow in the inductor 508.

The common-mode current flow in the inductor 508 may be reduced, for example, by placing a high impedance path from the center tap 504 of the inductor 508 to electrical ground (or another reference potential). However, this may entail additional components, resulting in larger area consumption of the TX chain (e.g., transmit chain 400) of a device. Aspects of the present disclosure divide the isolation ring 510 by providing at least one center strip across the ring, which provides increased common-mode isolation without the use of additional components or the consumption of greater area, as illustrated in FIG. 5B.

FIG. 5B illustrates the isolation ring 510 of FIG. 5A with a strip 512 of electrically conductive material connecting two different points of the ring, in accordance with aspects of the present disclosure. As illustrated, common-mode current 502 through the inductor 508 may couple image current 506 onto the ring 510. However, the image currents 506A and 506B coupled onto the ring 510 may now flow through the center strip 512 as shown. Therefore, the image currents 506A and 506B no longer cancel each other out as was the case in the isolation ring 510 presented with respect to FIG. 5A. Therefore, image currents 506A and 506B actually flow through the ring 510, and thus, by including the center strip 512, the isolation ring 510 will serve to isolate, or at least counteract, magnetic fields generated by common-mode current 502 in the inductor 508.

As illustrated, the center strip 512 may be located on, or otherwise aligned with an axis of symmetry of the inductor 508. For example, the axis of symmetry may run across an input port of the inductor 508. By locating the center strip aligned with the axis of symmetry, the common-mode isolation of the ring 510 may be increased. Moreover, any impact to the inductance (L) or the quality factor (Q) of the inductor 508 may be reduced (e.g., minimized) with the symmetrical placement of the center strip. However, when the location of the center strip is limited (e.g., due to other components or features in an integrated circuit (IC) or on a printed circuit board (PCB)), the location of the center strip may be offset from the axis of symmetry. The amount of offset from the axis of symmetry may depend on the L and Q sensitivity of a corresponding circuit for which the inductor is used.

While aspects described with respect to FIG. 5A have used a single inductor to facilitate understanding, magnetic fields from a plurality of inductors may be isolated using an isolation ring and one or more center strips. For example, as illustrated in FIG. 5B, the inductor 508 may be a winding (e.g., primary winding) of a transformer balun 414, magnetically coupled with another winding 514 (e.g., secondary winding) of the balun 414, both of which may be disposed inside the isolation ring 510. As illustrated, the center strip 512 is disposed across an axis of symmetry of both windings 508 and 514 of the transformer balun 414. Thus, the isolation ring 510 may isolate magnetic fields caused by common-mode currents in both windings.

Figure 6:
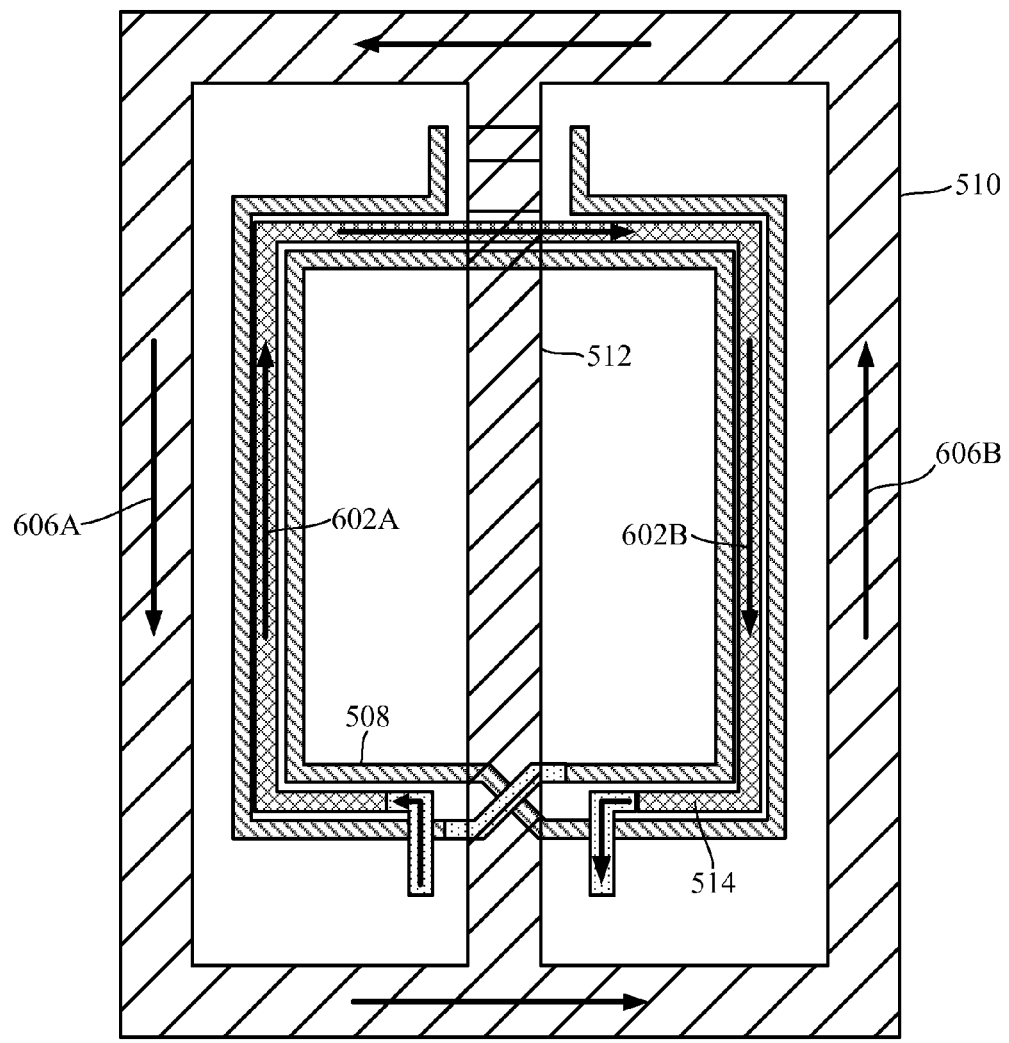
FIG. 6 illustrates differential-mode current flowing through one of the transformer windings in the example layout of FIG. 5B, in accordance with certain aspects of the present disclosure.

As illustrated in FIG. 6, the isolation ring 510 including the center strip 512 will also serve to isolate magnetic fields generated by differential-mode current flow 602 in the inductor 508. FIG. 6 illustrates the inductor 508 of FIG. 5B with differential-mode current flow (e.g., represented by arrows 602A and 602B), in accordance with certain aspects of the present disclosure. As illustrated by the arrows 602A and 602B, the direction of differential-mode current flow at a first side of the inductor 508 is in the same direction as the differential-mode current flow at a second side of the inductor 508. Thus, resultant image currents 606A and 606B coupled onto the ring 510 are in the same direction, and therefore, the image currents 606A and 606B may not flow through the center strip 512. In other words, the center strip 512 may have little to no impact on isolation of magnetic fields caused by differential-mode currents in the inductor 508.

While example aspects provided herein have illustrated a rectangular isolation ring, an isolation ring having other shapes may be used. For example, the isolation ring may be circular. In certain aspects, the shape of the isolation ring may be determined based on a shape of an inductive element (e.g., inductor 508) disposed inside the ring. For example, if an isolation ring is configured to isolate, or at least reduce, magnetic fields generated by a circular inductor, then the isolation ring may also have a corresponding, circular shape.

Figure 7B:
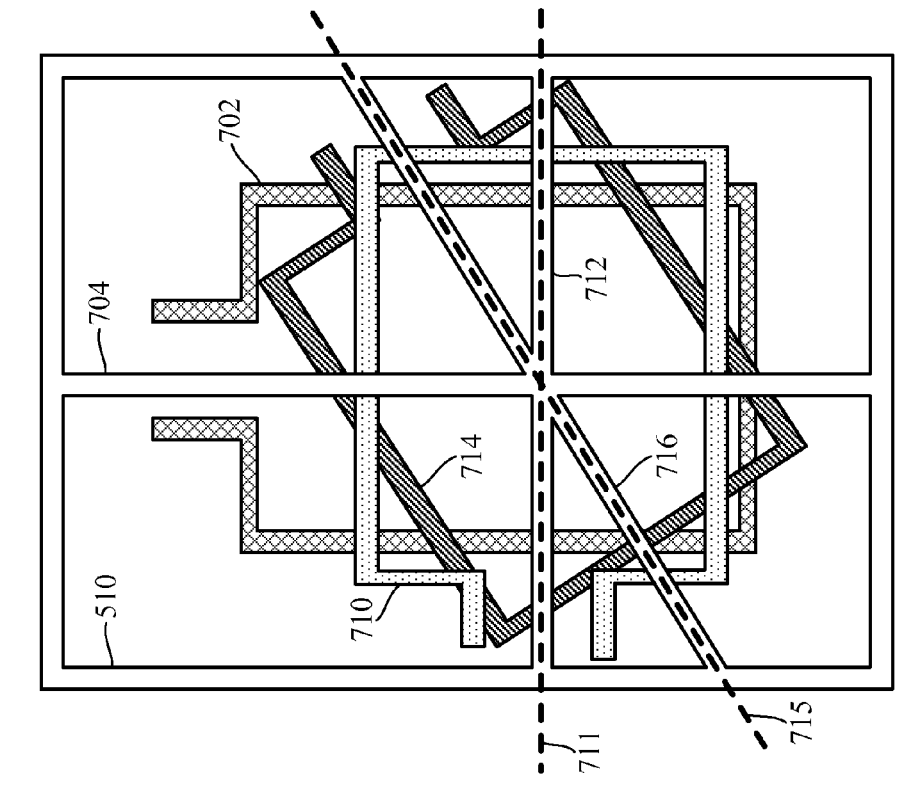
FIGS. 7A and 7B are example layouts of inductors with varying orientations inside an isolation ring, in accordance with certain aspects of the present disclosure.
Figure 7A:
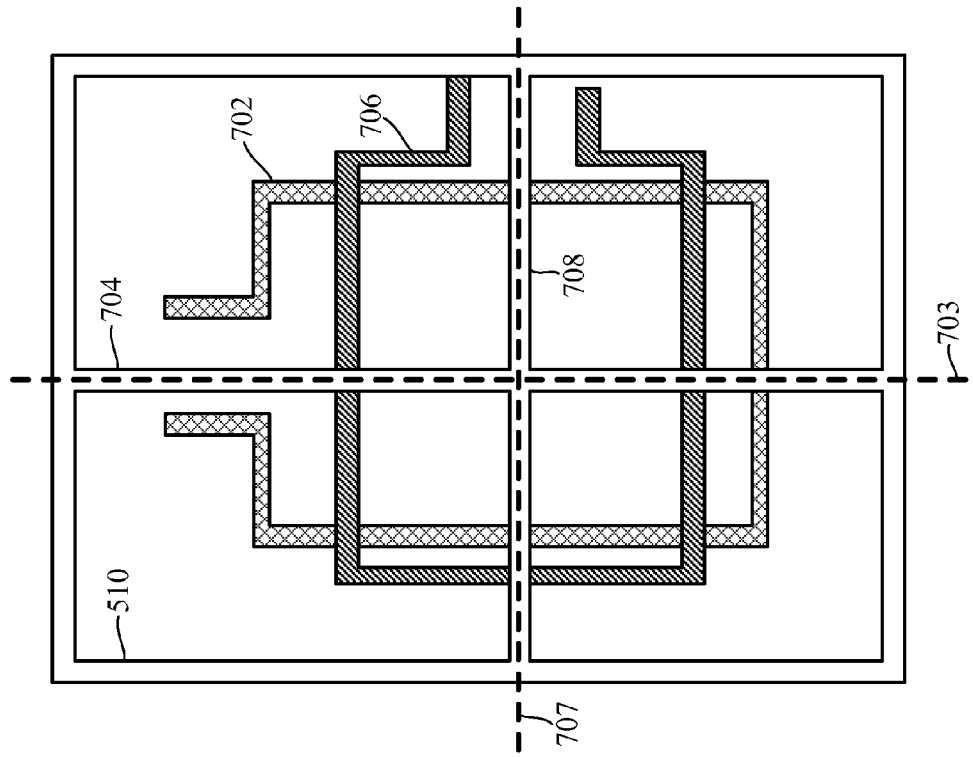

FIGS. 7A and 7B illustrate example layouts of inductors with varying orientations inside the isolation ring 510, in accordance with certain aspects of the present disclosure. As illustrated in FIG. 7A, an inductor 702 may be disposed inside the isolation ring 510 together with another inductor 706. For example, at least a portion of the inductors 702 and 706 may be disposed on different layers. In this case, an axis of symmetry 703 running across an input port of the inductor 702 is not aligned with an axis of symmetry 707 running across an input port of the inductor 706. Therefore, a strip 704 of electrically conductive material may be disposed inside the isolation ring 510 aligned with the axis of symmetry 703 of the inductor 702, and another strip 708 of conductive material may be disposed inside the ring 510 along the axis of symmetry 707 of the inductor 706. Thus, an image current coupled onto the ring 510 due to a common-mode current flowing in inductor 702 may flow through the strip 704, and an image current coupled onto the ring 510 due to a common-mode current flowing in inductor 706 may flow through the strip 708.

FIG. 7B illustrates the inductor 702, together with an inductor 710 and inductor 714, disposed inside the isolation ring 510. As illustrated, while an axis of symmetry 703 (or 711) across an input port of inductor 702 (or 710) is perpendicular to a side of the ring 510, this may not be the case for other inductors (e.g., inductor 714). Thus, strip 704 (e.g., for isolation of inductor 702) and strip 712 (e.g., for isolation of inductor 710) are each perpendicular to a side of the ring 510. However, a strip 716 (e.g., for isolation of inductor 714) may be connected to the ring 510 at an angle such that the strip 716 runs on an axis of symmetry 715 of inductor 714. While FIG. 7B illustrates an example of three inductors inside the isolation ring 510 to facilitate understanding, persons of ordinary skill in the art will appreciate that techniques described herein can be applied to any number of inductive elements in various orientations.

Figure 8:
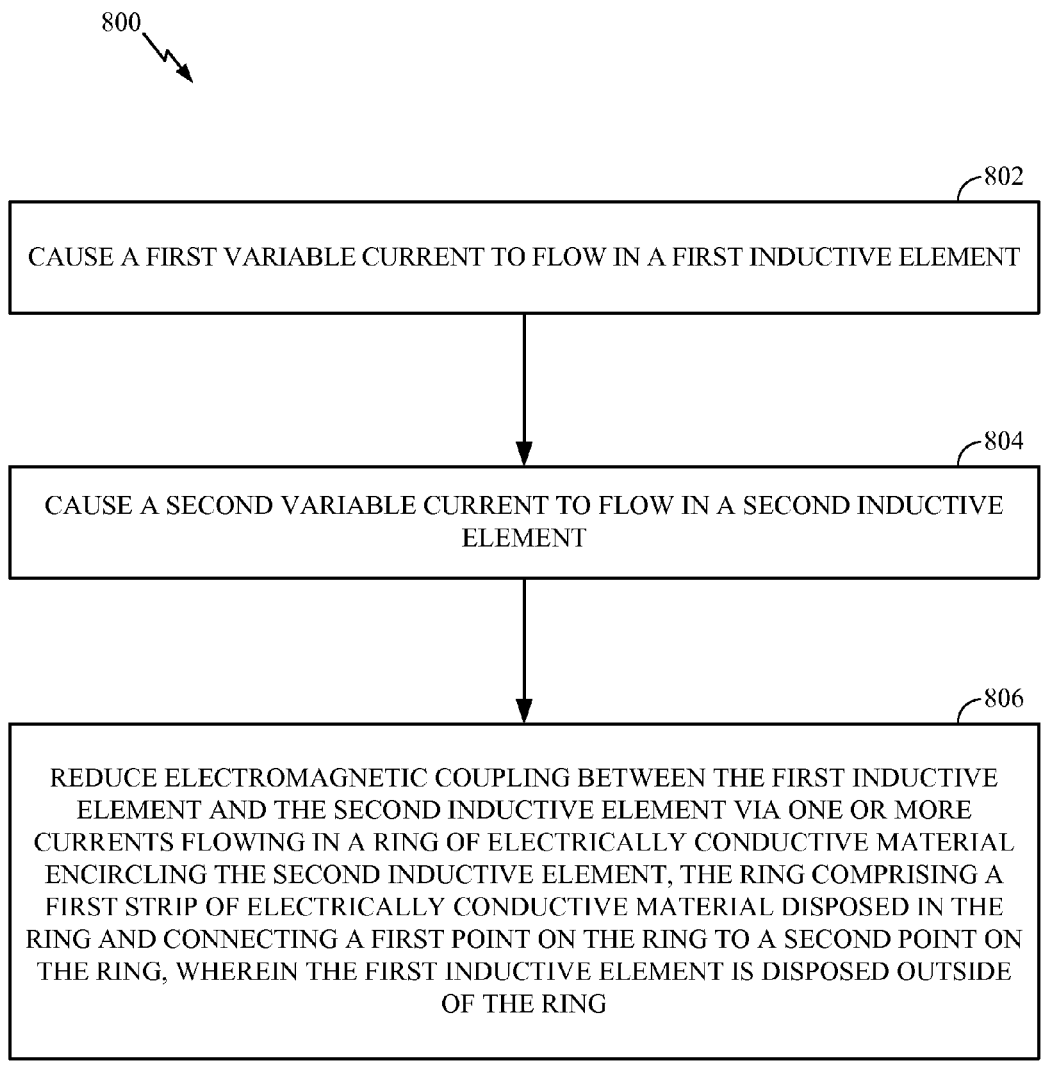
FIG. 8 is a flow diagram of example operations for operating an electrical circuit, in accordance with certain aspects of the present disclosure.

FIG. 8 is a flow diagram of example operations 800 for operating an electrical circuit, in accordance with certain aspects of the present disclosure. The operations 800 may begin, at block 802, by causing a first variable current to flow in a first inductive element (e.g., a VCO inductor). At block 804, a second variable current is caused to flow in a second inductive element (e.g., a winding of a balun). At block 806, electromagnetic coupling between the first inductive element and the second inductive element is reduced via one or more currents flowing in a ring (e.g., ring 510) of electrically conductive material encircling the second inductive element. The first inductive element may be disposed outside of the ring. The ring has a first strip (e.g., strip 512) of electrically conductive material disposed in the ring and connecting a first point on the ring to a second point on the ring.

According to certain aspects, the operations 800 further involve inducing an image current to flow in the ring via a magnetic field generated by the second variable current flowing in the second inductive element, wherein the one or more currents in the ring include the image current. The image current may include a common-mode image current, in which case the first strip provides a loop in the ring for the common-mode image current to flow. For certain aspects, a first common-mode image current component of the image current, coupled onto a first portion of the ring by a first common-mode current component flowing in the second inductive element, is configured to flow through the first strip. In this case, a second common-mode image current component of the image current, coupled onto a second portion of the ring by a second common-mode current component flowing in the second inductive element, is configured to flow through the first strip in the same direction as the first common-mode image current component. For certain aspects, the image current includes a differential-mode image current. In this case, the ring provides a loop for the differential-mode image current to flow, and an amount of the differential-mode image current flowing in the first strip may be zero (or at least negligible).

According to certain aspects, the ring is electrically floating. For other aspects, the ring may be connected to an electric potential, such as electrical ground or a power supply rail (e.g., VDD).

According to certain aspects, the second inductive element has a first line of symmetry. In this case, the first strip may be aligned with the first line of symmetry, at least through the second inductive element.

According to certain aspects, the ring is configured to encircle a third inductive element. For certain aspects, the second inductive element has a first line of symmetry, the third inductive element has a second line of symmetry aligned with the first line of symmetry, and at least a portion of the first strip is disposed in a plane defined by the first line of symmetry and the second line of symmetry. For certain aspects, the ring further includes a second strip of electrically conductive material disposed in the ring and connecting a third point on the ring with a fourth point on the ring. In this case, the second inductive element may have a first line of symmetry, the third inductive element may have a second line of symmetry at an angle with respect to the first line of symmetry, the first strip may be aligned with the first line of symmetry, and the second strip may be aligned with the second line of symmetry.

The various operations or methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

For example, means for transmitting may comprise a transmitter (e.g., the transceiver front end 254 of the user terminal 120 depicted in FIG. 2 or the transceiver front end 222 of the access point 110 shown in FIG. 2) and/or an antenna (e.g., the antennas 252ma through 252mu of the user terminal 120m portrayed in FIG. 2 or the antennas 224a through 224ap of the access point 110 illustrated in FIG. 2). Means for receiving may comprise a receiver (e.g., the transceiver front end 254 of the user terminal 120 depicted in FIG. 2 or the transceiver front end 222 of the access point 110 shown in FIG. 2) and/or an antenna (e.g., the antennas 252ma through 252mu of the user terminal 120m portrayed in FIG. 2 or the antennas 224a through 224ap of the access point 110 illustrated in FIG. 2). Means for processing or means for determining may comprise a processing system, which may include one or more processors, such as the RX data processor 270, the TX data processor 288, and/or the controller 280 of the user terminal 120 illustrated in FIG. 2. Means for causing a variable current to flow may include an amplifier (e.g., the driver amplifier 314 and/or the power amplifier 316 depicted in FIG. 3) or a charged capacitor in a resonant circuit of a VCO (e.g., VCO 402 as shown in FIG. 4), as understood by a person having ordinary skill in the art. Means for reducing electromagnetic coupling between the inductive elements may include a ring of electrically conductive material (e.g., isolation ring 510 illustrated in FIGS. 5A-7B).

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory) and the like. Also, "determining" may include resolving, selecting, choosing, establishing, and the like.

As used herein, a phrase referring to "at least one of" a list of items refers to any combination of those items, including single members. As an example, "at least one of a, b, or c" is intended to cover a, b, c, a-b, a-c, b-c, a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user terminal 120 (see FIG. 1), a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC (Application Specific Integrated Circuit) with the processor, the bus interface, the user interface in the case of an access terminal), supporting circuitry, and at least a portion of the machine-readable media integrated into a single chip, or with one or more FPGAs (Field Programmable Gate Arrays), PLDs (Programmable Logic Devices), controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. An apparatus for reducing electromagnetic coupling between multiple inductive elements comprising:
    an electrical component having a first inductive element; and
    a ring of electrically conductive material encircling the first inductive element, wherein the ring has a first strip of electrically conductive material disposed in the ring and connecting a first point on the ring to a second point on the ring.

2. The apparatus of claim 1, wherein the first strip provides a loop in the ring for a common-mode image current to flow.

3. The apparatus of claim 1, wherein a first common-mode current, coupled onto a first portion of the ring by a second common-mode current flowing in the first inductive element, is configured to flow through the first strip.

4. The apparatus of claim 3, wherein a third common-mode current, coupled onto a second portion of the ring by the second common-mode current flowing in the first inductive element, is configured to flow through the first strip in the same direction as the first common-mode current.

5. The apparatus of claim 1, wherein the ring is electrically floating.

6. The apparatus of claim 1, wherein the first inductive element has a first line of symmetry and wherein the first strip lies on the first line of symmetry.

7. The apparatus of claim 6, wherein the first strip follows the entire first line of symmetry through the first inductive element.

8. The apparatus of claim 1, wherein the electrical component has a second inductive element and wherein the ring is configured to encircle the first inductive element and the second inductive element.

9. The apparatus of claim 8, wherein the electrical component comprises a transformer and wherein the first and second inductive elements comprise windings of the transformer.

10. The apparatus of claim 8, wherein the first inductive element has a first line of symmetry, wherein the second inductive element has a second line of symmetry aligned with the first line of symmetry, and wherein at least a portion of the first strip is disposed in a plane defined by the first line of symmetry and the second line of symmetry.

11. The apparatus of claim 8, wherein the ring further comprises a second strip of electrically conductive material disposed in the ring and connecting a third point on the ring with a fourth point on the ring.

12. The apparatus of claim 11, wherein the first inductive element has a first line of symmetry, wherein the second inductive element has a second line of symmetry at an angle with respect to the first line of symmetry, wherein the first strip is aligned with the first line of symmetry, and wherein the second strip is aligned with the second line of symmetry.

13. The apparatus of claim 12, wherein the first strip is perpendicular to the second strip.

14. The apparatus of claim 1, wherein the ring is electromagnetically coupled to the first inductive element.

15. The apparatus of claim 1, wherein the first strip is configured to divide the ring into two halves.

16. The apparatus of claim 1, wherein the first strip is configured to reduce common-mode coupling with another electrical component located outside the ring.

17. The apparatus of claim 1, wherein the ring is rectangular.

18. A method of operating an electrical circuit, comprising:
causing a first variable current to flow in a first inductive element;
causing a second variable current to flow in a second inductive element; and
reducing electromagnetic coupling between the first inductive element and the second inductive element via one or more currents flowing in a ring of electrically conductive material encircling the second inductive element, the ring comprising a first strip of electrically conductive material disposed in the ring and connecting a first point on the ring to a second point on the ring, wherein the first inductive element is disposed outside of the ring.

19. The method of claim 18, further comprising inducing an image current to flow in the ring via a magnetic field generated by the second variable current flowing in the second inductive element, wherein the one or more currents in the ring comprise the image current.

20. The method of claim 19, wherein the image current comprises a common-mode image current and wherein the first strip provides a loop in the ring for the common-mode image current to flow.

21. The method of claim 19, wherein a first common-mode image current component of the image current, coupled onto a first portion of the ring by a first common-mode current component flowing in the second inductive element, is configured to flow through the first strip.

22. The method of claim 21, wherein a second common-mode image current component of the image current, coupled onto a second portion of the ring by a second common-mode current component flowing in the second inductive element, is configured to flow through the first strip in the same direction as the first common-mode image current component.

23. The method of claim 19, wherein the image current comprises a differential-mode image current, wherein the ring provides a loop for the differential-mode image current to flow, and wherein an amount of the differential-mode image current flowing in the first strip is zero.

24. The method of claim 18, wherein the ring is electrically floating.

25. The method of claim 18, wherein the second inductive element has a first line of symmetry and wherein the first strip is aligned with the first line of symmetry at least through the second inductive element.

26. The method of claim 18, wherein the ring is configured to encircle a third inductive element.

27. The method of claim 26, wherein the second inductive element has a first line of symmetry, wherein the third inductive element has a second line of symmetry aligned with the first line of symmetry, and wherein at least a portion of the first strip is disposed in a plane defined by the first line of symmetry and the second line of symmetry.

28. The method of claim 26, wherein the ring further comprises a second strip of electrically conductive material disposed in the ring and connecting a third point on the ring with a fourth point on the ring.

29. The method of claim 28, wherein the second inductive element has a first line of symmetry, wherein the third inductive element has a second line of symmetry at an angle with respect to the first line of symmetry, wherein the first strip is aligned with the first line of symmetry, and wherein the second strip is aligned with the second line of symmetry.

* * * * *